United States Patent
Ferrand et al.

(10) Patent No.: US 9,880,241 B2
(45) Date of Patent: Jan. 30, 2018

(54) CIRCULARLY POLARIZED TRANSCEIVER FOR MAGNETIC RESONANCE IMAGING

(71) Applicant: Commissariat à l'énergie atomique et aux énergies alternatives, Paris (FR)

(72) Inventors: Guillaume Ferrand, Paris (FR); Michel Luong, Sceaux (FR)

(73) Assignee: COMMISSARIAT À L'ÉNERGIE ATOMIQUE ET AUX ÉNERGIES ALTERNATIVES, Paris (FR)

( * ) Notice: Subject to any disclaimer, the term of this patent is extended or adjusted under 35 U.S.C. 154(b) by 506 days.

(21) Appl. No.: 14/643,669

(22) Filed: Mar. 10, 2015

(65) Prior Publication Data

US 2015/0253398 A1    Sep. 10, 2015

(30) Foreign Application Priority Data

Mar. 10, 2014 (FR) .................................. 14 51923

(51) Int. Cl.
    *G01R 33/36* (2006.01)
    *G01R 33/34* (2006.01)
    (Continued)

(52) U.S. Cl.
    CPC ......... *G01R 33/3642* (2013.01); *G01R 33/34* (2013.01); *G01R 33/341* (2013.01);
    (Continued)

(58) Field of Classification Search
    CPC .. G01R 33/3642; G01R 33/34; G01R 33/341; G01R 33/3415; G01R 33/3628; G01R 33/422
    See application file for complete search history.

(56) References Cited

U.S. PATENT DOCUMENTS 4,853,660 A * 8/1989 Schloemann ............. H01P 1/11
                                                              333/204
5,949,311 A * 9/1999 Weiss ...................... H01P 1/215
                                                              333/202
(Continued)

FOREIGN PATENT DOCUMENTS

WO    WO 2007/141505 A1    12/2007

OTHER PUBLICATIONS

Preliminary Search Report as issued in French Patent Application No. 1451923, dated Nov. 6, 2014.
(Continued)

*Primary Examiner* — Rodney Bonnette
(74) *Attorney, Agent, or Firm* — Pillsbury Winthrop Shaw Pittman LLP

(57) ABSTRACT

A patch resonator for nuclear magnetic resonance device includes a ground plane, a conductive element, a dielectric element positioned between the ground plane and the conductive element, the resonator being able to transmit a circularly polarized radiofrequency signal when the resonator is supplied by a first transmission line connected to the conductive element via a first connection point and able to receive alternatively a radiofrequency signal circularly polarized in the opposite direction when the resonator is connected to a second transmission line via a second connection point, the resonator including a switch mounted in parallel on each transmission line at a distance from the ground plane corresponding to $(2n+1)\lambda/4$ with n a natural integer, and $\lambda$ the wavelength of the guided wave in the transmission line at the operating frequency of the resonator, the switch making it possible to electrically connect/disconnect the transmission lines from the conductive element.

14 Claims, 3 Drawing Sheets

(51) Int. Cl.
   *G01R 33/341*   (2006.01)
   *G01R 33/3415*  (2006.01)
   *G01R 33/422*   (2006.01)

(52) U.S. Cl.
   CPC ..... *G01R 33/3415* (2013.01); *G01R 33/3628* (2013.01); *G01R 33/422* (2013.01)

(56) References Cited

U.S. PATENT DOCUMENTS

| 8,159,223 | B2* | 4/2012 | Luekeke | G01R 33/341 |
| | | | | 324/318 |
| 8,269,498 | B2* | 9/2012 | Zhang | G01R 33/3415 |
| | | | | 324/318 |
| 2007/0229076 | A1 | 10/2007 | Habara et al. | |
| 2015/0260806 | A1* | 9/2015 | Yoo | G01R 33/3415 |
| | | | | 324/322 |

OTHER PUBLICATIONS

Y. Pang et al., "MR experiment validation of parallel traveling-wave with quadrature patch antenna transceiver array," Proceedings of the International Society for Magnetic Resonance in Medicine, 19th Annual Meeting and Exhibition, May 7-13, 2011, vol. 19, 1904, Apr. 23, 2011.

B. Zhang et al., "Design of a Patch Antenna for Creating Traveling Waves at 7 Tesla," Proceedings of the International Society for Magnetic Resonance in Medicine, 17th Scientific Meeting and Exhibition, Apr. 18-24, 2009, vol. 17, 4746, Apr. 4, 2009.

G. Shajan et al., "Rat brain MRI at 16.4T using a capacitively tunable patch antenna in combination with a receive array," NMR in Biomedicine, vol. 25, No. 10, Feb. 17, 2012, pp. 1170-1176.

J. Hoffman et al., "Human Brain Imaging at 9.4 T Using a Tunable Patch Antenna for Transmission," Magnetic Resonance in Medicine, vol. 69, No. 5, Jun. 12, 2012, pp. 1494-1500.

X. Yang et al., "T/R Switches, Baluns, and Detuning Elements in MRI RF coils," Proceedings of the International Society for Magnetic Resonance in Medicine, 14th Annual Meeting and Exhibition, May 6-12, 2006, vol. 1 , Apr. 22, 2006.

X. Zhang et al., "Single-Feed quadrature coils as transceiver array elements for improved SNR and transmit efficiency," Proceedings of the International Society for Magnetic Resonance in Medicine, 17th Scientific Meeting and Exhibition, Apr. 18-24, 2009, vol. 17, Apr. 4, 2009.

Y. Pang et al., "Parallel Traveling-wave MRI: Antenna Array Approach to Traveling-wave MRI for Parallel Transmission and Acquisition" Proceedings of the International Society for Magnetic Resonance in Medicine, 18th Scientific Meeting and Exhibition, May 1-7, 2010, vol. 18, Apr. 17, 2010.

\* cited by examiner

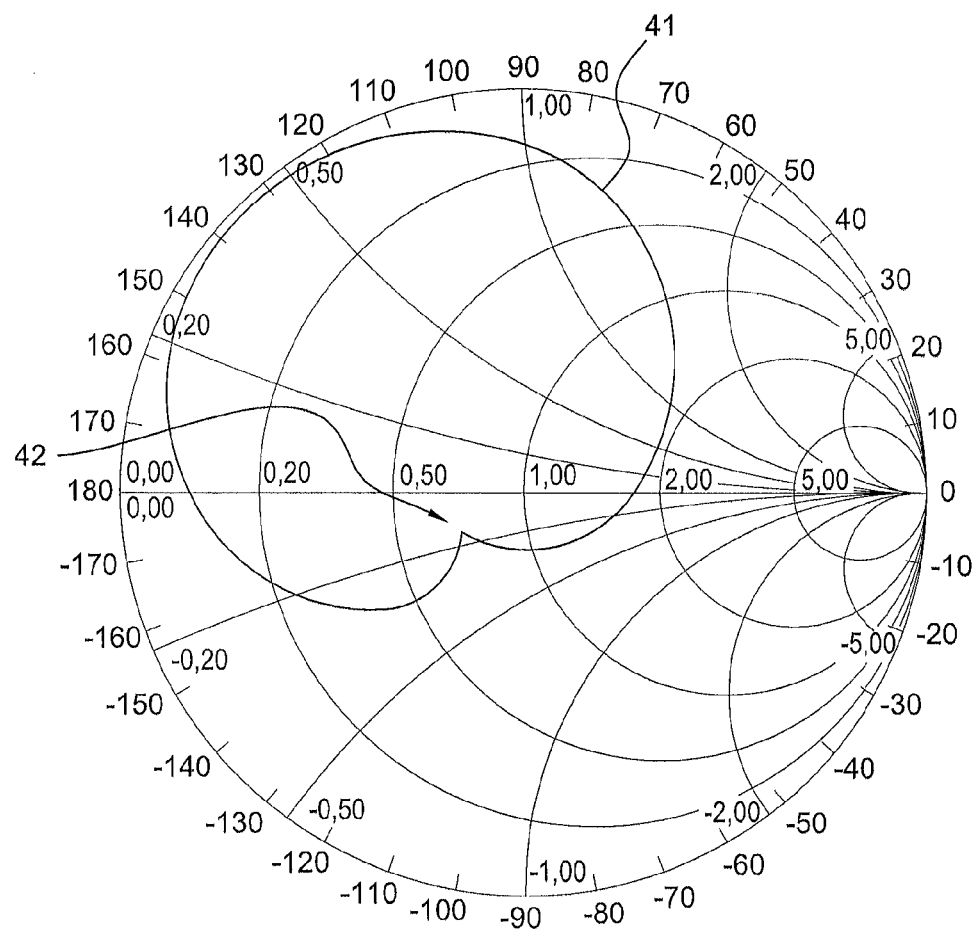
Fig. 6
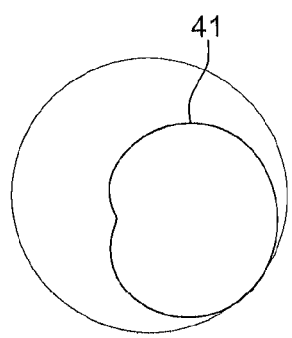 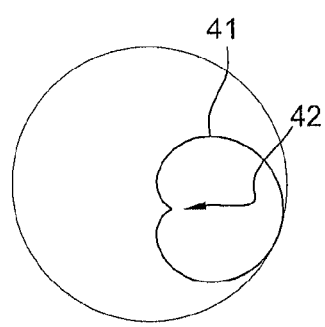 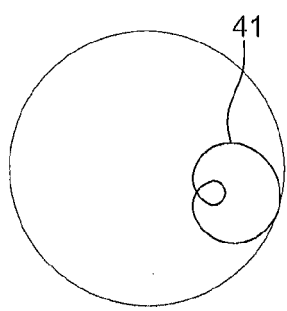
Fig. 7a   Fig. 7b   Fig. 7c

CIRCULARLY POLARIZED TRANSCEIVER FOR MAGNETIC RESONANCE IMAGING

CROSS REFERENCE TO RELATED APPLICATIONS

This application claims the benefit of priority from French Patent Application No. 1451923 filed on Mar. 10, 2014, the entire content of which is incorporated herein by reference.

FIELD

The present invention relates to a circularly polarized transceiver for Magnetic Resonance Imaging (MRI).

The technical field of the invention is that of high frequency antennas (RF coils) and their use in Nuclear Magnetic Resonance devices for humans or animals.

In Magnetic Resonance Imaging (MRI), an antenna is used in transmission for generating a radiofrequency field having a magnetic component $B_1$ orthogonal to the static field $B_0$, capable of exciting the nuclei of atoms, in particular those of hydrogen (for so-called proton MRI) within the sample placed in the antenna. During the phenomenon of relaxation, a radiofrequency signal also having a component $B_1$ of very small amplitude is re-emitted by the sample. It may then be detected either by the same antenna switched at that moment onto the reception chain provided with very low noise amplifiers, or by another dedicated antenna. The static magnetic field $B_0$ in which the sample is bathed determines the frequency of the signal which is proportional thereto. Thus, it goes from 64 MHz to 128 MHz for a field $B_0$ of 1.5 and 3 teslas respectively.

For MRI scanners, referred to as high field, that is to say in which the field $B_0$ exceeds 3 teslas, an antenna is generally composed of several resonators placed in array in order to obtain, on the one hand, uniform excitation through the parallel transmission process and, on the other hand, better sensitivity during reception which improves the quality of the image. These resonators transmit and receive radiofrequency signals.

The invention relates to a type of resonator particularly suited to the exploration, by imaging or spectroscopy, of a region situated in the axis of the magnetic field $B_0$, especially the top of the head in humans or large primates.

BACKGROUND

The operation of high field MRI coils (that is to say above 3 teslas) is characterised by an inhomogeneity of the radiofrequency magnetic fields transmitted or detected by a single resonator: $B_1^+$ during transmission and $B_1^-$ during reception. The quantity $B_1^+$ corresponds to the circular polarization of the magnetic field turning in the same direction as the nuclear spins used for the imaging. In contrast, the quantity $B_1^-$ is the polarization which turns in the opposite direction and which characterises the reception sensitivity. The inhomogeneity of magnetic field is inherent in electromagnetism equations. It increases with the frequency of the signal and consequently with the magnetic field $B_0$.

During transmission, the inhomogeneity of $B_1^+$ results on an image in the appearance of zones of shade or artificial contrast, which are difficult to interpret. To overcome this, an array antenna formed by a multitude of resonators is used, to make uniform directly $B_1^+$ as well as the flip angle. This compensation will be all the more efficient the higher the number of resonators in an array antenna.

During reception, a larger number of resonators will provide a more uniform overall reception profile with an increase in the signal to noise ratio. This increase could be taken advantage of to enhance the resolution of the image or to reduce the acquisition time by using an acceleration method that employs the differential sensitivity between resonators due to their construction or distribution around the sample.

Conventionally, two types of resonators exist which are used in high field MRI: linear resonators (or striplines) and circular resonators or loops.

When the sample to be studied is a human head, these resonators are placed there around on a surface parallel to the head-feet axis of the patient, which also coincides with the direction of the static field $B_0$. In this configuration, the resonators illuminate little the region of the brain situated at the top of the head. Vice-versa, they also receive little signal from this region.

Given the geometry of the head and the antennas, a first improvement solution would consist in placing, at the top of the head, a transceiver resonator having a symmetrical shape with respect to the head-feet axis, such as for example a resonator-loop of which the surface of the resonator would be orthogonal to said head-feet axis.

Nevertheless, the magnetic field radiated by a loop is essentially orthogonal to its surface. Thus, the component $B_1$ would be essentially parallel to $B_0$, thus inefficient in magnetic resonance. Only the near region of the conductor of the loop has a correctly oriented and efficient component $B_1$. This observation has led to a strategy where a large number of loops of reduced size are used in arrays to seek, on the one hand, an increase in the edge effect by the increase in the total length of the conductors forming the loops and, on the other hand, a more favourable orientation of the radiated magnetic fields. Despite its relevance, this solution has two major drawbacks. Firstly, the formation and the adjustment of the array of loops are very complex. In fact, each loop has to resonate at the Larmor frequency, have a precise terminal impedance and not couple with neighbouring loops in order not to reduce the output of the array during transmission or instead increase the correlated noise during reception. Then, the array does not make it possible to explore with good sensitivity the deeper regions of the brain, especially above the thalamus because the depth of penetration of the radiated field decreases with the size of the loops.

The precession movement of the spins induces a circular polarization in the radiofrequency magnetic fields brought into play in MRI. For a given resonator, the channel that transmits the polarization $B_1^+$ will be used for exciting the spins and the channel that transmits the polarization $B_1^-$ will be used to receive the relaxation signal by virtue of the reciprocity principle. Channel is taken to mean a physical port via which the resonator is connected to the outside world. Linear or circular resonators transmit a linearly polarized magnetic field. Yet, a linear polarization is the result of the superposition of two circular polarizations turning in the opposite direction, to be specific $B_1^+$ and $B_1^-$. Thus, the same channel may be used alternatively during transmission and during reception. However, half of the available power is not exploited each time. Consequently, the output and the field sensitivity of the resonator are reduced by 40% respectively during transmission and during reception.

A particularly beneficial solution consists in using a "patch" type circular resonator. Such a resonator has been used in addition to an array antenna for transmitting a circular polarization ([1] Hoffmann, J. et al. (2013), Human Brain Imaging at 9.4 T Using a Tunable Patch Antenna for Transmission. Magnetic Resonance in Medicine, 69: 1494-1500). Typically, such a resonator is constituted of a metal surface deposited on a dielectric plate of which the second face is covered by a ground plane.

This type of resonator is known and used in the field of radiofrequency antennas for data communication. The resonator described in the document WO 2007/14105 requires a disc of 320 mm diameter made of poly-tetra-fluoro-ethylene (PTFE) for a resonance frequency of 400 MHz. The diameter of the radiating element is 210 mm. The supply is realised through a 90° hybrid coupler in two points situated on the periphery of the radiating element and on two orthogonal axes going through its centre to form a transmission channel. For a "patch" resonator, the diameter of the disc is all the larger the smaller the resonance frequency. Thus for an application with an MRI scanner of 7 teslas at 298 MHz, the diameter of the radiating element according to the teaching of this document would exceed 320 mm while conserving the same substrate made of PTFE. A large diameter, besides the problem of overall dimensions in a MRI scanner, would increase the mutual coupling towards the linear or circular resonators which have to be placed as close as possible to the head and with which the "patch" resonator has to be integrated to form an array antenna.

Thus, for a medical imaging application, the external diameter of the "patch" resonator should not exceed 180 mm so that the latter can be placed at around 40 mm with respect to the top of the head.

Three methods are known for reducing the size of a "patch" resonator.

A first method consists in choosing a substrate with a markedly higher dielectric constant (typically an alumina ceramic) making it possible to reduce the wavelength of the signal propagated in the substrate. This varies in a first approximation as the inverse square root of the dielectric constant. Nevertheless, the formation of a printed circuit made of ceramic is more difficult and costly compared to a polymer substrate. It also makes the device more fragile mechanically vis-à-vis acoustic vibrations generated by the gradient magnets in a MRI scanner.

A second method consisting in making appropriately oriented slits also makes it possible to reduce the resonance frequency for a given geometry, and by extension, to reduce the size of the resonator for a given frequency ([2] Wong, K.-L. and Lin, Y.-F. (1998), Circularly polarised microstrip antenna with a tuning stub. Electronic Letters, Vol. 34, No. 9: 831-832). However, the slits such as they appear in the document have a major drawback in that they significantly reduce the magnetic field in the useful zone in MRI, close to the resonator and around the axis of symmetry.

A third method consists in mounting capacitors between the radiating element and the ground plane so as to reduce the size of a "patch" resonator. This method is particularly described in the document WO 2007/141505. Nevertheless, capacitors have intrinsic losses characterised by a quality factor. These losses increase proportionally to the value of the capacitance, and inversely proportional to the quality factor. Moreover, the capacitors should withstand voltages greater than 2000 volts for an incident power of 1 kW when the resonator is used during transmission. Yet, among available industrial capacitors, the higher the permissible voltage, the lower the quality factor. The losses reduce the output and the sensitivity of the resonator, respectively during transmission and during reception. This approach is thus only valid in the case where the output and the sensitivity are not determining criteria, as may be the case in the field of RFID (radiofrequency identification) and as is exactly the reverse case in the field of MRI.

Finally, still with the objective of reducing the overall dimensions of the resonator, it is beneficial to find a solution for obtaining a "patch" resonator without resorting to a hybrid circuit.

The reference [2] proposes a "patch" resonator without the use of a hybrid circuit. The resonator described comprises two possible connection positions, one for transmitting and receiving a LHCP polarization and the other for transmitting and receiving a RHCP polarization. The joint use of the two positions has not been envisaged for this resonator. But if the two positions had to be connected simultaneously, there would be strong mutual coupling at the level of the connection points during transmission and during reception which would result in a loss of power, around 40% of power. Such a resonator is thus not suited to be used in the field of nuclear magnetic resonance imaging.

Furthermore, the resonator described in reference [2] has irreversible adjustment means for the efficiency of the polarization and the operating frequency. These do not offer the flexibility required of a resonator used in the field of nuclear magnetic resonance imaging because these adjustments depend on the size and shape of the human head placed in its vicinity.

Given all these constraints and the prior art, "patch" resonators, although very widespread in telecommunications, are still very little used in the MRI field. In fact, none of the solutions described is satisfactory for Magnetic Resonance Imaging (MRI) at very high magnetic field.

Thus, the solutions proposed do not resolve either the problem of size of the "patches" (because they require the addition of supplementary electrical components), or even the problem of sufficient performance for an MRI application.

SUMMARY

In this context, an aspect of the present invention aims to resolve the aforementioned problems by proposing a compact planar resonator, referred to as "patch" resonator, for Magnetic Resonance Imaging and alternatively making it possible to transmit a Left Hand Circular Polarization (LHCP) and to receive a Right Hand Circular Polarization (RHCP) through two separate radiofrequency ports.

To this end, an embodiment of the invention proposes a "patch" resonator for nuclear magnetic resonance device including: a ground plane, a conductive element, a dielectric element positioned between the ground plane and the conductive element, the resonator being able to transmit a circularly polarized radiofrequency signal when the resonator is supplied by a first transmission line connected to the conductive element by means of a first connection point and able to receive alternatively a radiofrequency signal circularly polarized in the opposite direction when the resonator is connected to a second transmission line via a second connection point, the resonator including a switching element or switch mounted in parallel on each transmission line at a distance from the ground plane corresponding to $(2n+1)\lambda/4$ with n a natural integer, and $\lambda$ the wavelength of the guided wave in the transmission line at the operating frequency of the resonator, the switching element making it possible to connect/disconnect said transmission lines.

An embodiment of the invention relates to a compact planar resonator for the transmission and the reception of a compact circularly polarized radiofrequency signal of dimensions less than or equal to $\lambda_0/5$, where $\lambda_0$ is the wavelength of the signal propagated in air. The resonator according to an embodiment of the invention includes an active switch, beneficially formed by PIN diodes, making it possible alternatively to transmit a LHCP circularly polarized signal and to receive a RHCP polarized signal through two separate radiofrequency ports, while saving on a 90° hybrid circuit to reduce to the maximum the overall dimensions of such a resonator.

The "patch" resonator according to an embodiment of the invention may also have one or more of the characteristics below, considered individually or according to any technically possible combinations thereof:

the switch is a PIN diode having an off state and an on state, the PIN diode associated with the first transmission line being off during transmission and on during reception, the PIN diode associated with the second reception transmission line being on during transmission and off during reception;

the resonator has a shielding; the shielding thus makes it possible to avoid mutual coupling with the linear or circular resonators which have to be placed as near as possible to the head and with which the "patch" resonator has to be integrated to form an array antenna;

the resonator has a first upper shielding and a second lateral shielding situated at the edge of the resonator;

the resonator includes:
  a second dielectric element located above the first dielectric element;
  a first upper shielding positioned on the upper face of the second dielectric element;
  a second lateral shielding at the edge of the resonator;

the resonator includes four variable capacitors making it possible to adjust the operating frequency of the resonator (tuning) and/or to adjust the impedance (impedance matching) at the level of the first connection point and the second connection point at the operating frequency of the resonator, and/or to adjust the efficiency of the circular polarizations; beneficially the four variable capacitors are very low values and thus have very limited power dissipation, and make it possible to adjust independently the three important parameters for the operation of the resonator in MRI;

the resonator includes four appendages arranged around the conductive element and electrically connected to the conductive element forming a triplate line impedance transformer; the appendages positioned at the periphery playing the role of an impedance transformer in triplate line topology beneficially return a capacitive effect, virtually without power dissipation, while assuring excellent voltage resistance;

the conductive element has the shape of a disc and has a plurality of radial slits, each of the radial slits extending from the edge of the conductive disc up to a given distance from the centre of the conductive disc;

the resonator comprises eight slits;

the two connection points are positioned at the surface of the conductive disc on two orthogonal straight lines, referred to as main axes, intersecting at the centre of the conductive disc, the two points being at an identical distance from the centre of the conductive disc;

the resonator includes four variable capacitors, the variable capacitors being positioned along two orthogonal straight lines, referred to as secondary axes, the secondary axes having an angular offset of 45° with respect to the main axes;

the variable capacitors are positioned at the intersections of the outer edges of the appendages and the two secondary axes.

An aspect of the invention also relates to a high frequency antenna for nuclear magnetic resonance device including a "patch" resonator according to an embodiment of the invention.

Beneficially the high frequency antenna for nuclear magnetic resonance device is a multi-channel antenna including a plurality of linear resonators having a rectilinear radiating element and/or a plurality of loop resonators including a radiating element forming a loop, the radiating elements being used to transmit an excitation radiofrequency signal and/or to receive a relaxation radiofrequency signal.

BRIEF DESCRIPTIONS OF THE FIGURES

Other characteristics and benefits of the invention will become clearer from the description that is given thereof below, by way of indication and in no way limiting, with reference to the appended figures, among which:

FIG. 6 is an illustration of a Smith abacus;

FIGS. 7a to 7c are representations of different limacons of Pascal.

DETAILED DESCRIPTION

Figure 1:
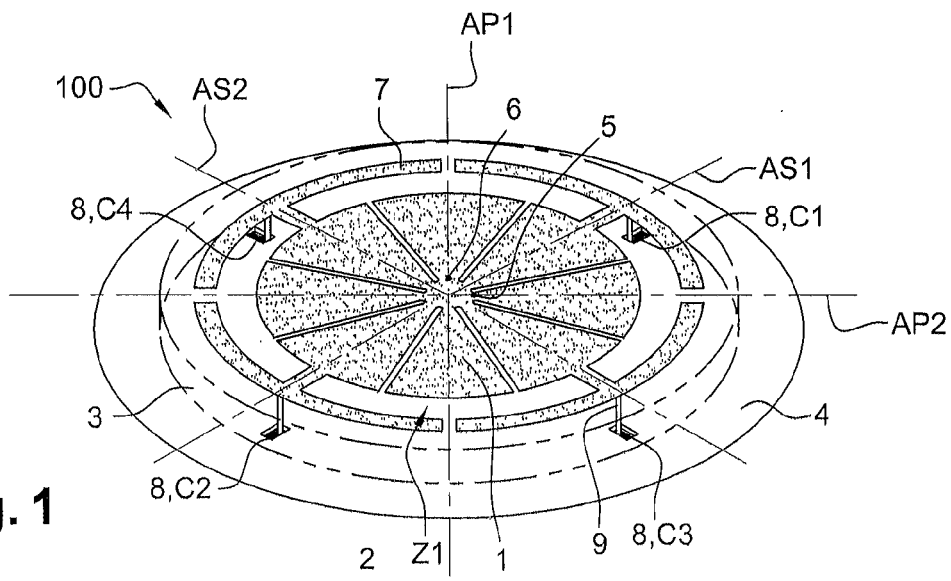
FIGS. 1 to 3 illustrate different perspective views of a "patch" resonator according to an embodiment of the invention.
Figure 2:
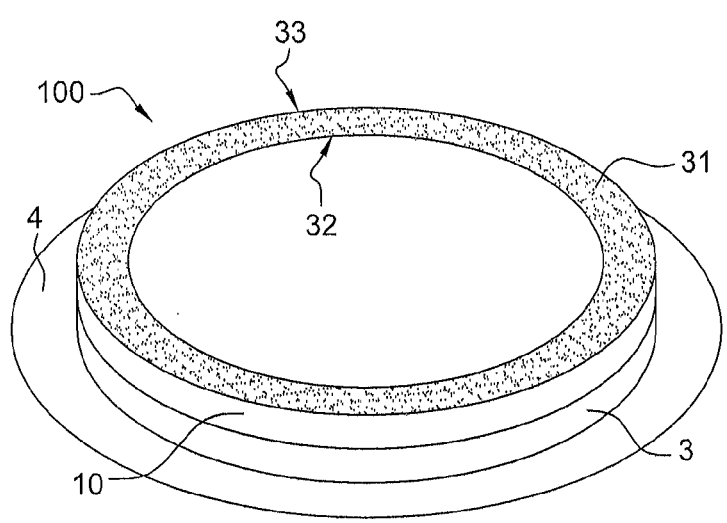
Figure 3:
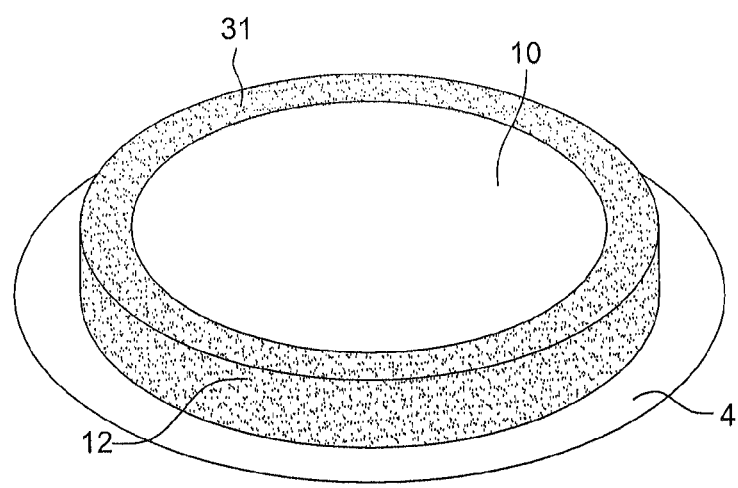
Figure 4:
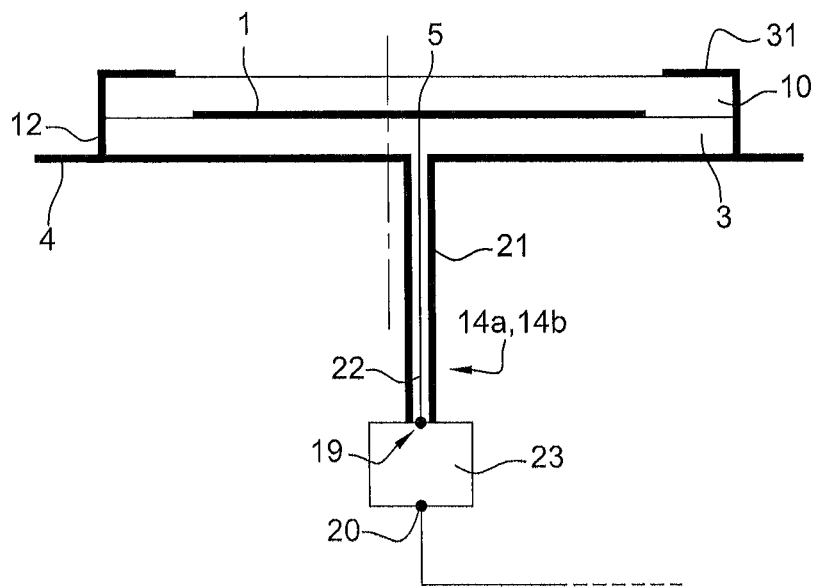
FIG. 4 illustrates a radial sectional view going through a connection point of the "patch" resonator according to the embodiment of the invention illustrated in FIGS. 1 to 3.

FIGS. 1 to 3 represent schematically a circular resonator 100, called "patch" resonator, according to an embodiment of the invention which can be used in transmission and in reception for Magnetic Resonance Imaging (MRI). FIG. 4 represents a radial sectional view of the circular resonator 100 illustrated in FIGS. 1 to 3 showing details of the connections.

FIGS. 1 to 4 will be described jointly.

The "patch" resonator 100 according to an embodiment of the invention comprises:
  a conductive disc 1;
  a disc made of dielectric material called lower substrate 3, onto which the conductive disc 1 is fixed;
  a ground plane 4 covering the lower face of the lower substrate 3;
  two connection points 5 and 6, each electrically connecting the conductive disc 1 to the central core 22 of a transmission line formed by a coaxial cable 14a, 14b of which the external conductor 21 is electrically connected to the ground plane 4;
  four appendages 7 in the form of a circular arc electrically connected in the middle thereof to the conductive disc 1 and positioned at the periphery of the conductive disc 1;
  four variable capacitors 8 of low value, typically from 0.5 to 2 pF, one for each appendage 7, enabling the adjustment of the resonator 100 in impedance adaptation (matching), operating frequency (tuning), and output of the circular polarizations.

The conductive disc 1 is beneficially made of copper and has a thickness corresponding to around six times the thickness of skin (penetration of the electromagnetic wave into the conductor) at the operating frequency of the resonator.

Beneficially, the conductive disc 1 has cut-outs oriented radially forming slits 2. The presence of slits 2 on the conductive disc 1, beneficially eight in number, makes it possible to reduce the resonance frequency of the resonator 100 for a given geometry. Consequently, the slits 2 make it possible to reduce the size of the conductive disc 1, and thus its overall dimensions, for the desired frequency of utilisation in MRI, and especially for a frequency of 298 MHz corresponding to the nuclear magnetic resonance frequency of protons at 7 teslas (T).

According to an embodiment of the invention, the slits 2 do not extend to the centre of the conductive disc 1 so as to improve the efficiency of the resonator 100, especially in the MRI field where the resonator operates in near field. Beneficially, the slits 2 extend radially up to the edge of the conductive disc 1, so as to avoid the appearance of currents induced by the pulsed gradient magnets of Nuclear Magnetic Resonance devices.

The disc forming the lower substrate 3 has a larger diameter than the diameter of the conductive disc 1 on which it rests. Beneficially, its thickness is chosen so as to obtain a good compromise between the radiation and the stability of the adjustment of the frequency. Beneficially, the thickness of the lower substrate 3 is comprised between $\frac{1}{10}^{th}$ and $\frac{1}{4}^{th}$ of the diameter of the conductive disc 1, and preferentially of the order of $\frac{1}{5}^{th}$ of the diameter of the conductive disc 1. Preferentially, in an embodiment, the lower substrate 3 is made of a material with very low dielectric loss.

The connection points 5 and 6 are placed on the conductive disc 1 and positioned along two orthogonal straight lines, hereafter called main axes AP1 and AP2, intersecting at the centre of the conductive disc 1. The two connection points 5 and 6 are positioned at an equal distance from the centre of the conductive disc 1.

The appendages 7 positioned around the conductive disc 1 have a role of impedance transformer to return a capacitive effect. They thus replace the capacitors used in "patch" resonators according to the prior art to reduce their overall dimensions and which are a source of loss of output and sensitivity of the resonator.

The variable capacitors 8 are electrically connected on the one hand to conductive wells 9 passing through the lower substrate 3 and connected to the appendages 7 and on the other hand to the ground plane 4. The variable capacitors 8 are positioned along two orthogonal straight lines, called secondary axes AS1 and AS2. The secondary axes are in the same plane as that formed by the main axes AP1, AP2 and have an angular offset of 45° with respect to the main axes AP1 and AP2.

According to an embodiment of the invention, and to further reduce the dimensions of the resonator by the reduction of the dimensions of the appendages 7 while conserving the same capacitive effect, a second disc made of dielectric material, called upper substrate 10 and a coronal shielding 31 are added to the resonator. The diameters, the thicknesses and the materials of the two substrates, lower 3 and upper 10, are, in an embodiment, beneficially identical.

The additional coronal shielding 31 is positioned on the upper face of the upper substrate 10. The inner radius 32 of the crown formed by the coronal shielding 31 is adapted as a function of the desired compromise between the circular polarization output and the mutual coupling of the "patch" resonator 100 with other resonators present in the vicinity, such as for example in an array antenna. Thus, the smaller the inner radius 32 of the coronal shielding 31, the greater the surface of the shielding, which makes it possible to minimize mutual coupling with other resonators but also reduces the efficiency of the resonator 100 due to the screening effect. In practice, for an application at 7T, this inner radius 32 will be situated between the outer radius of the conductive disc 1 and the inner radius formed by the appendages 7, i.e. in the hatched zone Z1 in FIG. 1.

The resonator 100 also comprises a lateral shielding 12 illustrated in FIG. 3 completing the upper coronal shielding 31. The lateral shielding 12 also makes it possible to reduce mutual coupling. Thus, the use of two shieldings 12 and 31 makes it possible to minimize mutual coupling in an optimal manner. Nevertheless, it is possible to use only the upper coronal shielding 31 uniquely to reduce the overall dimensions of the appendages 7.

Figure 5:
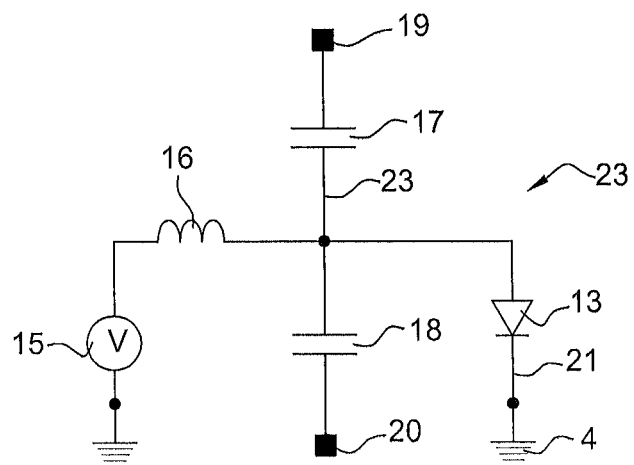
FIG. 5 illustrates schematically a switching circuit of the "patch" resonator according to an embodiment of the invention.

In order to use a same "patch" resonator alternatively during transmission and during reception respectively in Left Hand Circular Polarization (LHCP) and Right Hand Circular Polarization (RHCP) without loss of efficiency or output, the resonator 100 according to an embodiment the invention comprises a switching circuit or switch 23, illustrated more particularly in FIG. 5, composed of a PIN (Positive Intrinsic Negative) diode 13 connected to each connection point 5 and 6. Each PIN diode 13 is connected in parallel to each coaxial cable 14a, 14b at a distance equal to $(2n+1)\lambda/4$ from the ground plane 4, with n a natural integer, and $\lambda$ the wavelength in the coaxial cable at the operating frequency. In a more general manner, the switching circuit or switch 23 is composed of a switching element which is:
  rapid; that is to say at least by a factor ten times less than the relaxation time of the atoms (for example 10 microseconds for protons for which the relaxation time is 100 microseconds);
  able to withstand the radiofrequency power, in general from several kilowatts to several tens of kilowatts.

FIGS. 4 and 5 show respectively details of the connections and details of the switching circuit 23. It should be noted that the diagrams shown are just as valid for the transmission cable as for the reception cable of the connection points.

FIG. 4 represents a radial section passing through a connection point 5 or 6. FIG. 5 shows the composition of the switching circuit 23 between the two interface ports 19, on the side of the coaxial line 14a, 14b, and 20 on the side of the MRI scanner. Beyond the interface port 20, the electronic transmission or reception circuit is conventional, and is composed at least of a power radiofrequency source during transmission and of a low noise preamplifier during reception. These elements being known, they will not be detailed in the present application.

Each PIN diode 13 is driven independently by a voltage generator 15. Thus, for a positive polarity, for example +10 Volts, the PIN diode 13 is referred to as on; it thus behaves electrically like a resistance of very low value close to 0.5 ohm (almost a short-circuit). Consequently, the impedance returned at the level of the ground plane 4 through the intermediary of the coaxial cable 14a, 14b is then, in a known manner, close to 5 kohms if the coaxial cable has a characteristic impedance of 50 ohms. In these conditions, everything takes place as if the associated connection point did not exist physically. On the other hand, if the polarity of the generator 15 is negative, for example −30 Volts, the PIN diode 13 will be referred to as off. It then behaves electrically like a capacitor of very low value (typically 0.7 pF) placed in parallel with a resistance of very high value (typically 200 kohms). In the domain of very high frequency electromagnetic waves of VHF (Very High Frequency) and UHF (Ultra High Frequency) type, everything takes place as if the PIN diode 13 did not exist. Thus, to transmit on the port connected to the connection point 5, the associated PIN diode 13 is driven with a negative polarity and the second PIN diode 13 connected to the connection point 6 is driven with a positive polarity simultaneously. During reception on the port connected to the point 6, it suffices to reverse the polarity of the two generators 15.

Each drive generator 15 is protected from high frequency currents by a shock inductance 16, typically of the order of 10 µH. Conversely, the high frequency circuits are isolated from the direct current of the drive generator 15 by two capacitors 17 and 18.

Implementation Example

An embodiment example is given for the construction and the adjustment of a "patch" resonator 100 operating at a frequency of 298 MHz, the frequency corresponding to the nuclear magnetic resonance frequency of protons at 7 teslas.

Thus, the conductive disc 1, with its slits 2 and its appendages 7 are etched by the printed circuit technique on a double copper layer laminate. The second copper layer is used to form the ground plane 4. This laminate also forms the lower substrate 3. The connection points 5 and 6 are obtained by the formation of metallized holes, generally called vias, which connect the two faces of the lower substrate 3. Said vias form conductive wells 9.

Beneficially, the same double layer laminate is also used to form the coronal shielding 31 and the upper substrate 10, except that thereon the second copper layer is entirely removed. The two laminates are then thermo-bonded by a polyolefin film. The lateral shielding 12 may be constituted of a copper adhesive strip, of the order of 80 µm thickness, bonded onto the resonator wafer. Welding points are formed so as to assure the electrical connection between the coronal shielding 31 in the upper part of the resonator 100 and the ground plane 4 in the lower part of the resonator 100. The diameter of the conductive disc 1 and the substrates 3 and 10 are respectively 120 mm and 180 mm.

The formation of the resonator 100 according to an embodiment of the invention needs an appropriate choice of dimensions of the appendages 7 and the slits 2, in order to reduce as far as possible the value of the variable capacitors 8 and thus minimize losses. If the appendages 7 are too short, the values of the capacitors will be too low. If the appendages are too long, the capacitors will be too bulky. The value of the capacitance returned by an appendage of length $2L_a$, is expressed approximately by the relation:

$$C \approx \frac{2}{\omega Z_0} \tan \beta L_a$$

where $Z_0$ and $\beta$ are respectively the characteristic impedance and the propagation constant of the triplate line formed by the coronal shielding 31, the appendage 7 and the ground plane 4. For an appendage characterised by an inner radius of 70 mm, an outer radius of 80 mm and a length of 110 mm, the returned equivalent capacitance is around 7 pF.

The conductive disc 1 comprises eight slits 2 which make it possible to reduce the dimensions of the resonator 100. The radial slits 2 are aligned on the bisecting lines formed between a main axis AP1, AP2 and a secondary axis AS1, AS2. They start at 10 mm from the centre of the conductive disc 1 and extend up to the edge thereof. The width of the slits is typically 2 mm.

The connection points 5 and 6 are arranged at 11.5 mm from the centre of the conductive disc 1. This position is chosen to obtain a crude impedance adaptation compared to a coaxial cable of characteristic impedance of 50 ohms.

With the arrangements described previously, a maximum value of 1 pF for the variable capacitors 8 suffices to achieve a fine impedance adaptation of the connection points 5 and 6, optimise the operating frequency at 298 MHz and maximize the efficiency of one of the circular polarizations. The adjustment method is detailed hereafter.

For a usage of an embodiment of the invention in magnetic resonance imaging, it is desirable that the plane of the conductive disc 1 is normal to the static magnetic field $B_0$ of the main magnet. Depending on the direction of $B_0$, oriented from the ground plane 4 to the conductive disc 1 or vice-versa, the connection point 5 will be used for the transmission and the connection point 6 for the reception or vice-versa.

The adjustment of the "patch" resonator 100 according to an embodiment of the invention takes place by means of 4 variable capacitors 8 visible in FIG. 1. Each capacitor has a current value noted: C1, C2, C3 and C4. The 4 variable capacitors 8 make it possible to adjust three parameters:
 the impedance presented by the connection points to the coaxial cables,
 the operating frequency,
 the efficiency or output of the circular polarizations.

The impedance of the "patch" resonator 100 reduces when C1 is increased while decreasing simultaneously C2 and while conserving an identical value for C3 and C4. The operating frequency increases when the sum C1+C2+C3+C4 decreases. The efficiency of the desired circular polarization varies when the ratio (C1+C2)/(C3+C4) is made to vary. The efficiency or the output of a polarization is evaluated experimentally or by simulation by the average value of the field $B_1^+$ in the region of the sample situated opposite the conductive disc 1.

The adjustment of the impedance takes place in a known manner thanks to the representation of the reflection coefficient as a function of the frequency. It aims to minimize the value of this coefficient at the operating frequency of the resonator 100.

The adjustment of the efficiency of the antenna is based on the representation of the reflection coefficient in a Smith abacus, as illustrated in FIG. 6, that is to say a representation in the complex plane of this coefficient for a linear variation of the frequency. In the general case, the line 41 has a shape resulting from a rotation and from a translation applied to a so-called limacon of Pascal curve, illustrated in FIGS. 7a to 7c, of general equation r=a+b×cos(θ), where r is the radius at the centre of the abacus, θ the angle, with a and b parameters that depend on the characteristics of the resonator and its adjustment.

The optimal adjustment corresponds to that where the limacon of Pascal degenerates into a cardioid, FIG. 7b, showing a double point 42 for which the associated frequency will be the operating frequency.

In the embodiment example, the optimal values of the capacitors C1 to C4 are 0.7 pF, 0.9 pF, 0.8 pF and 0.8 pF respectively.

The invention claimed is:
1. A patch resonator for nuclear magnetic resonance device comprising:

a ground plane;

a conductive element;

a first dielectric element positioned between the ground plane and the conductive element, the resonator being configured to transmit a circularly polarized radiofrequency signal when the resonator is supplied by a first transmission line connected to the conductive element via a first connection point and configured to receive alternatively a radiofrequency signal circularly polarized in the opposite direction when the resonator is connected to a second transmission line via a second connection point, and a switch mounted in parallel on each transmission line at a distance from the ground plane corresponding to $(2n+1)\lambda/4$ with n a natural integer, and $\lambda$ the wavelength of a guided wave in the transmission line at the operating frequency of the resonator, the switch making it possible to electrically connect/disconnect the first and second transmission lines from the conductive element.

2. The patch resonator for nuclear magnetic resonance device according to claim 1, wherein the switch is a PIN diode having an off state and an on state, the PIN diode associated with the first transmission line being off during transmission and on during reception, the PIN diode associated with the second reception transmission line being on during transmission and off during reception.

3. The patch resonator for nuclear magnetic resonance device according to claim 1, wherein the resonator has a shielding.

4. The patch resonator for nuclear magnetic resonance device according to claim 1, wherein the resonator has a first upper shielding and a second lateral shielding at the level of a wafer of said resonator.

5. The patch resonator for nuclear magnetic resonance device according to claim 1, further comprising:
 a second dielectric element located above the first dielectric element;
 a first upper shielding positioned on the upper face of the second dielectric element;
 a second lateral shielding at the edge of said resonator.

6. The patch resonator for nuclear magnetic resonance device according to claim 1, further comprising four variable capacitors making it possible to adjust the operating frequency of the resonator and/or to adjust the impedance at the level of the first connection point and the second connection point at the operating frequency of the resonator, and/or to adjust the efficiency of the circular polarizations.

7. The patch resonator for nuclear magnetic resonance device according to claim 6, wherein the two connection points are positioned at a surface of the conductive disc on two orthogonal main axes intersecting at a centre of the conductive disc, the two connection points being at an identical distance from the centre of the conductive disc.

8. The patch resonator for nuclear magnetic resonance device according to claim 7, further comprising four variable capacitors, the variable capacitors being positioned along two orthogonal secondary axes, the secondary axes having an angular offset of 45° with respect to the main axes.

9. The patch resonator for nuclear magnetic resonance device according to claim 8, wherein the variable capacitors are positioned at the intersections of the external edges of the appendages and the two secondary axes.

10. The patch resonator for nuclear magnetic resonance device according to claim 1, wherein the conductive element has the shape of a disc and has a plurality of radial slits, each of the radial slits extending from an edge of the conductive disc up to a given distance from the centre of the conductive disc.

11. The patch resonator for nuclear magnetic resonance device according to claim 10, wherein the resonator comprises eight slits.

12. The patch resonator for nuclear magnetic resonance device according to claim 1, further comprising four appendages arranged around the conductive element and electrically connected to the conductive element forming a triplate line impedance transformer.

13. A high frequency antenna for nuclear magnetic resonance device comprising a patch resonator according to claim 1.

14. The high frequency antenna for nuclear magnetic resonance device according to claim 13, wherein the antenna is a multi-channel antenna comprising a plurality of linear resonators having a rectilinear radiating element and/or a plurality of loop resonators comprising a radiating element forming a loop, the radiating elements being used to transmit an excitation radiofrequency signal and/or to receive a relaxation radiofrequency signal.

* * * * *